(12) United States Patent
Hirata et al.

(10) Patent No.: US 6,633,054 B2
(45) Date of Patent: Oct. 14, 2003

(54) METHOD OF FABRICATING A SEMICONDUCTOR LIGHT-EMITTING DEVICE AND THE SEMICONDUCTOR LIGHT-EMITTING DEVICE

(75) Inventors: Shoji Hirata, Kanagawa (JP); Hironobu Narui, Kanagawa (JP)

(73) Assignee: Sony Corporation (JP)

( * ) Notice: Subject to any disclaimer, the term of this patent is extended or adjusted under 35 U.S.C. 154(b) by 29 days.

(21) Appl. No.: 09/789,560

(22) Filed: Feb. 22, 2001

(65) Prior Publication Data

US 2001/0017375 A1 Aug. 30, 2001

(30) Foreign Application Priority Data

Feb. 29, 2000 (JP) ..................... P2000-053760

(51) Int. Cl.[7] ........................... H01L 29/221
(52) U.S. Cl. ................. 257/96; 257/79; 257/94
(58) Field of Search ................ 257/79, 94, 95, 257/96; 372/46, 50

(56) References Cited

U.S. PATENT DOCUMENTS

| 4,546,480 A | * | 10/1985 | Burnham et al. | ............. 372/45 |
|---|---|---|---|---|
| 4,813,050 A | * | 3/1989 | Shima et al. | ............. 372/43 |
| 5,524,017 A | * | 6/1996 | Endo | ............. 372/46 |
| 5,559,058 A | * | 9/1996 | Zory, Jr. et al. | ............. 437/237 |
| 5,838,704 A | * | 11/1998 | Mihashi et al. | ............. 372/45 |

* cited by examiner

Primary Examiner—Sara Crane
(74) Attorney, Agent, or Firm—Rader, Fishman & Grauer PLLC; Ronald P. Kananen

(57) ABSTRACT

A method of fabricating a semiconductor light-emitting device in which the window structure can readily be obtained without relying upon an advanced process technology. In the method of the present invention, a first multi-layered film formed on a substrate is patterned into a groove pattern having a widened portion and narrowed portions provided on both sides of such widened portion. A second multi-layered film is then epitaxially grown on the substrate so as to cover the groove pattern, by successively growing an n-type second lower clad layer, a second active layer, a p-type second upper clad layer and a p-type cap layer. The cap layer is then patterned to thereby form a current injection layer on the second multi-layered film within the groove pattern so as to be extended along the longitudinal direction of such groove pattern.

6 Claims, 7 Drawing Sheets

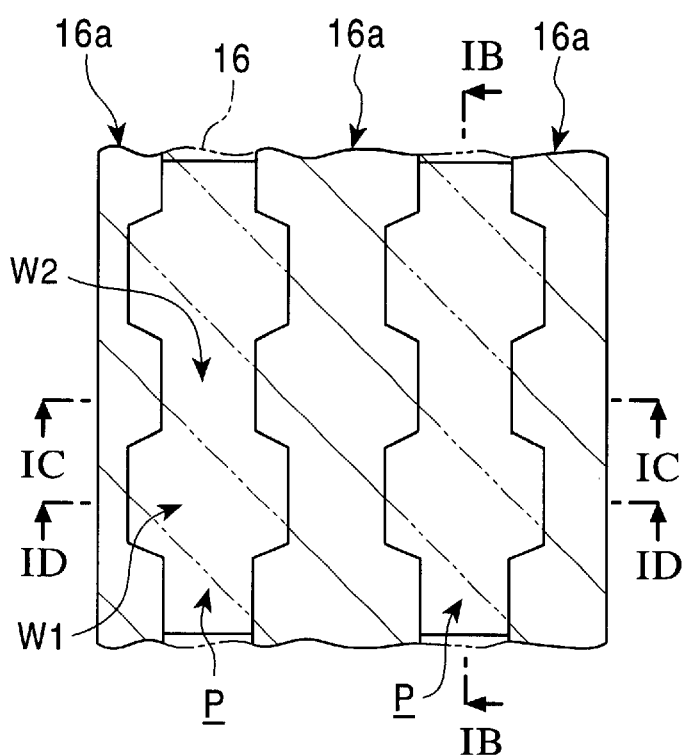
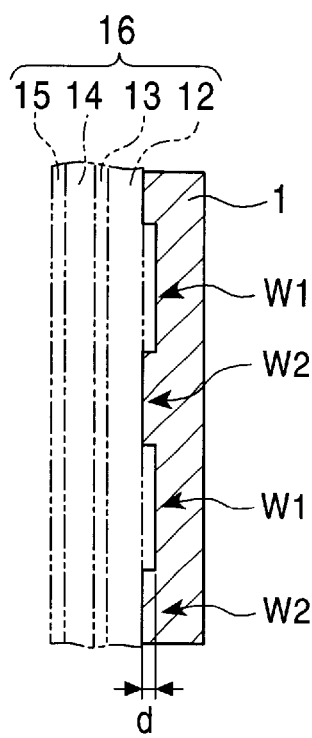
FIG. 1A   FIG. 1B
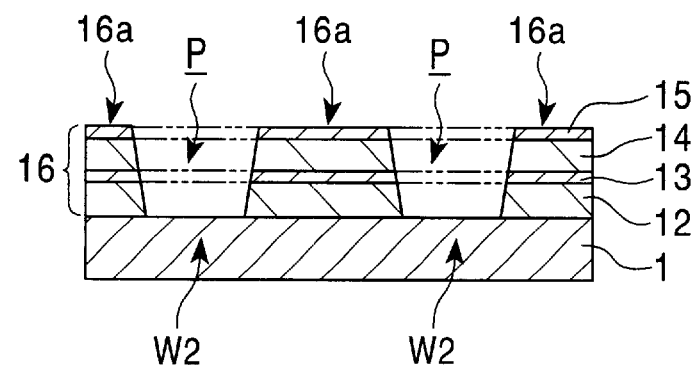
FIG. 1C
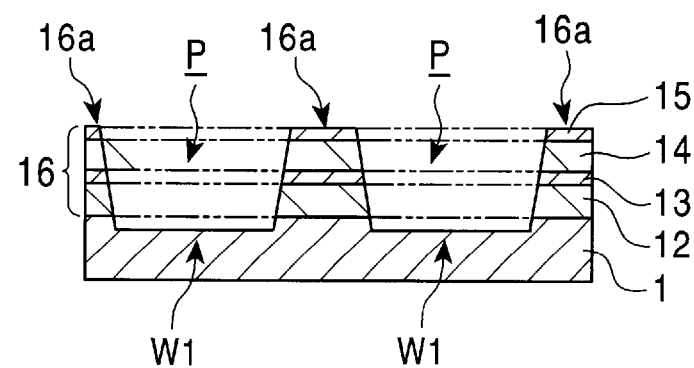
FIG. 1D

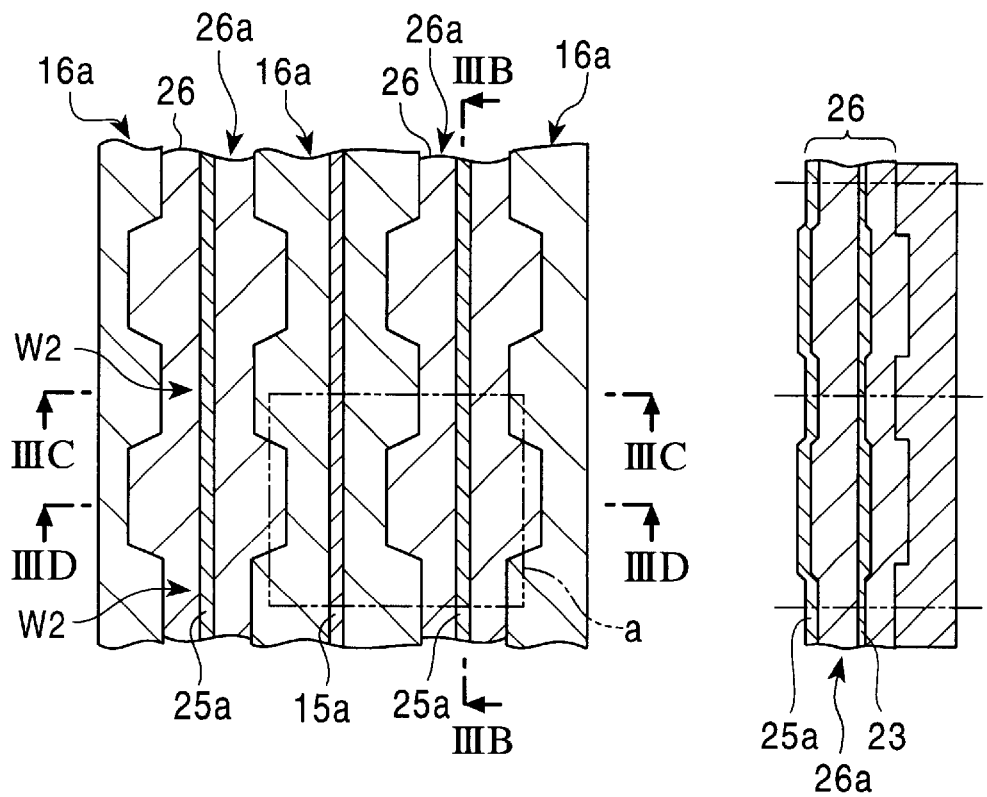
FIG. 3A
FIG. 3B
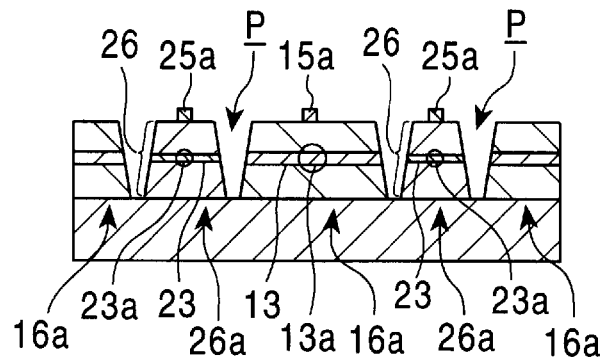
FIG. 3C
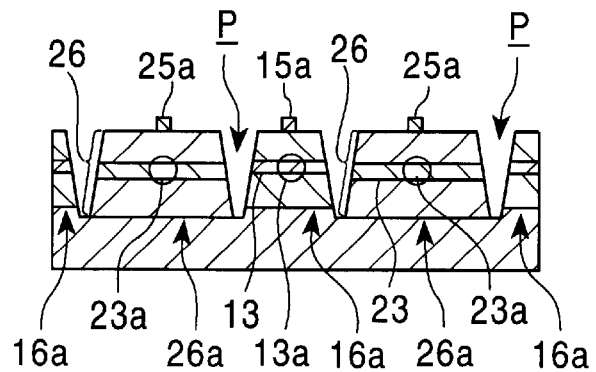
FIG. 3D

US 6,633,054 B2

METHOD OF FABRICATING A SEMICONDUCTOR LIGHT-EMITTING DEVICE AND THE SEMICONDUCTOR LIGHT-EMITTING DEVICE

BACKGROUND OF THE INVENTION

1. Field of the Invention

The present invention relates to a method of fabricating a semiconductor light-emitting device and the semiconductor light-emitting device obtained by such method, and in particular to a method of fabricating a semiconductor device having on a substrate a multi-layered film which includes an active layer, and the semiconductor light-emitting device obtained by such method.

2. Description of the Related Art

An optical pickup used for read/write (record/playback) to or from optical recording media such as CD (compact disc) and DVD (digital versatile disc) incorporates a semiconductor light-emitting device.

An exemplary constitution of such semiconductor light-emitting device is shown in FIG. 7A and FIG. 7B, which are a plan view and a sectional view taken along the line VIIB—VIIB in FIG. 7A, respectively. The semiconductor device shown in these figures has on a single substrate 101 a first semiconductor laser element L101 and a second semiconductor laser element L201, both elements being differed in the emission wavelength. The semiconductor laser elements L101, L201 are respectively composed of multi-layered film patterns P101, P201 which individually comprise lower clad layers 102, 202, active layers 103, 203 individually having a quantum well structure, and upper clad layers 104, 204 individually having a conduction type different from that of the lower clad layers 102, 202, all of which are stacked in this order; and current injection layers 105, 205 individually formed thereon.

In a fabrication process of such semiconductor light-emitting device, at first a multi-layered film made of AlGaAs-base (aluminum gallium arsenide-base) material for composing the first semiconductor laser element L101 is epitaxially grown on the substrate 101 made of, for example, GaAs (gallium arsenide). The multi-layered film is then patterned to form a plurality of the first multi-layered film patterns P101 spaced in a predetermined distance apart from each other. Here the individual first multi-layered film patterns P101 have a uniform line width of approximately 150 μm. A multi-layered film made of AlGaInP-base (aluminum-gallium-indium-phosphorus-base) material for composing the second semiconductor laser element L201 is epitaxially grown on the substrate 101 and is then patterned to form a plurality of the second multi-layered film patterns P201 of a constant width between each adjacent first multi-layered film patterns P101.

Next, the top epitaxial layers of the individual multi-layered film patterns P101, P201 are patterned to form the first current injection layer 105 on the top of the first multi-layered film pattern P101 and, likewise, to form the second current injection layer 205 on the top of the second multi-layered film pattern P201 so as to extend along the longitudinal direction of the both patterns P101, P201, respectively. This forms current bottlenecking layers 103a, 203a (so-called stripes) in the individual active layers 103, 203 in the respective multi-layered film patterns P101, P201. The substrate 101 is then divided in a pair of the first multi-layered film pattern P101 and the second multi-layered film pattern P201 formed thereon, and the multi-layered film patterns P101, P201 and the substrate 101 are then cleft en bloc in a plane normal to their longitudinal direction. Thus, a semiconductor light-emitting device having on a single substrate 101 the semiconductor laser elements L102, L201 differing in the emission wavelength is obtained.

In the thus obtained semiconductor light-emitting device, the active layers 103, 203 have a resonation structure by having cleft planes on both ends of the multi-layered film patterns P101, P202, so that light emitted from the active layers 103, 203 can be resonated and drawn out through such cleft planes.

However, the semiconductor light-emitting device having such constitution is disadvantageous in that the band gap of the active layers 103, 203 becomes smaller in the vicinity of the cleft planes than in the central portion due to interfacial levels, poor heat conduction and large light density in the vicinity of the cleft planes. Hence, in the semiconductor laser element composed of an AlGaInP-base material, light generated at around the central portion of the stripe 203a is likely to be absorbed in the vicinity of the cleft planes, which undesirably increases an amount of heat generation, limits a maximum oscillation output and induces fracture of the cleft planes.

To overcome the foregoing problems, a so-called window structure capable of expanding the band gap in the vicinity of the cleft planes of the active layer is provided. Semiconductor light-emitting devices based on such window structure are roughly classified into those having the multi-layered film pattern whose cleft plane sides are filled with a large-band-gap material, and those having the multi-layered film pattern in which impurity is diffused in the vicinity of cleft planes so as to destroy the super lattice structure of the active plane, to thereby expand the band gap.

Fabrication of such window structure, however, requires complicated processes and high-precision process technology, thus increasing the production cost and lowering the yield of the semiconductor light-emitting devices.

For example, in the formation of the semiconductor light-emitting device for emitting red laser light, the active layer is diffused with Zn (zinc) as an impurity in the vicinity of the cleft planes. Zinc, however, tends to produce a non-emissive sensor within the active layer, which is causative of degrading the property and thus compromising the reliability of the device if present in the light-emissive region. For this reason, it is necessary that an amount of zinc diffused within the active layer in the vicinity of the cleft planes is set to be large in order to expand the band gap, but it has to be set at approximately zero in the central area which serves as a light-emissive region. Thus, an advanced process technology is required for precisely controlling the diffusion area and diffusion depth of zinc.

SUMMARY OF THE INVENTION

It is therefore an object of the present invention to provide a method of fabricating a semiconductor light-emitting device by which the window structure can readily be obtained without relying upon the advanced technology, and the semiconductor light-emitting device obtained by such method.

A method of fabricating a semiconductor light-emitting device to accomplishing the foregoing objective is a method of fabricating a semiconductor light-emitting device having on a substrate a semiconductor light-emitting element, and being characterized by a procedure as described below. First, a material layer formed on the substrate is patterned to thereby form a groove pattern having a widened portion and narrowed portions provided on both sides of the widened portion, the narrowed portions are provided with openings which are narrower in width that the widened portion. Next, a multi-layered film composed of a lower clad layer, an active layer and an upper clad layer having a conduction type differing from that of the lower clad layer, stacked in this order is formed on the substrate so as to cover the groove pattern. Thereafter, a current injection layer is formed on the multi-layered film within an area corresponding to the groove pattern so as to extend along the longitudinal direction of the groove pattern.

In such fabrication method, since the multi-layered film is formed so as to cover the groove pattern having the widened portion, a thickness of the individual layers composing the multi-layered film formed within the groove pattern is larger in the widened portion than in the narrowed portions provided on both sides thereof. This is attributable to the fact that a larger amount of source materials can be supplied to the widened portion than to the narrowed portion (rate determined by supply volume), and that the source materials supplied to the narrowed portion is likely to be consumed due to abnormal film growth at the upper portion of the etched side wall of the groove pattern. Thus, by patterning such multi-layered film, while aligning the portion thereof formed within the widened portion to the center, and the portions formed on both sides thereof to the edge, a semiconductor light-emitting device can be produced to as to having an active layer in which a film is thinner at both ends than in the center, and therefore having the window structure in which the band gap of the active layer is higher in both edge portions than in the central portion.

A semiconductor light-emitting device of the present invention is such that being obtained as described in the above, wherein a multi-layered film pattern composed of a lower clad layer, an active layer and an upper clad layer having a conduction type different from that of said lower clad layer stacked in this order is formed on a substrate and, on such multi-layered film pattern, a stripe of a current injection layer is provided so as to extend over both edges of the multi-layered film pattern. The active layer thereof is characterized in that being formed so that both end portions thereof along the longitudinal direction of the current injection layer is thinner than the central portion.

BRIEF DESCRIPTION OF THE DRAWINGS

The above and other objects, features and advantages of the present invention will become more apparent from the following description of the presently preferred exemplary embodiments of the invention taken in conjunction with the accompanying drawings, in which:

FIGS. 1A to 1D are a schematic plan view and sectional views for explaining a first embodiment;

FIGS. 3A to 3D are a schematic plan view and sectional views for explaining a process as continued from FIGS. 2A and 2B;

DESCRIPTION OF THE PREFERRED EMBODIMENTS

Figure 2A:
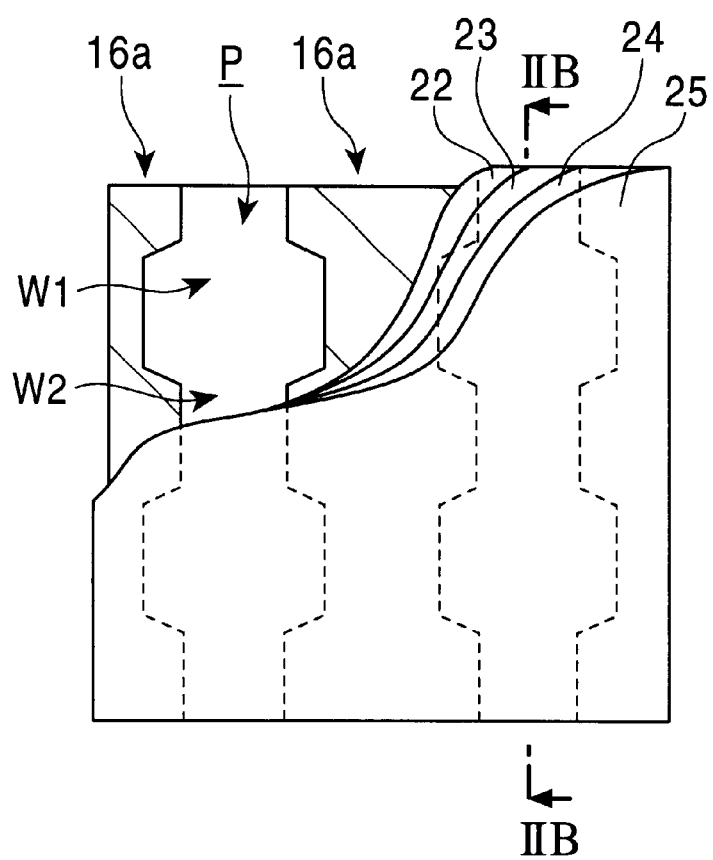
FIGS. 2A and 2B are a schematic plan view and a sectional view for explaining a process as continued from FIGS. 1A to 1D.

Embodiments of a semiconductor light-emitting device and a method of fabricating thereof will be detailed hereinafter referring to the attached drawings.

First Embodiment

FIGS. 1A to 1D, FIGS. 2A and 2B, and FIGS. 3A to 3D are plan views and sectional views for explaining a first embodiment of the present invention. The following paragraphs describe the present invention embodied as a semiconductor light-emitting device having semiconductor laser elements which differ in the emission wavelength (a first laser element and a second laser element) mounted on the same substrate, the explanation herein will be started with a fabrication process thereof.

As shown in FIGS. 1A to 1D, an n-type substrate 1 made of, for example, GaAs is obtained. The substrate 1 is now selected as a so-called off-angled substrate having a surface slanted at a certain angle from a crystal plane of GaAs. More specifically, the off-angled substrate preferably has a surface slanted at 3° to 15°, and more preferably 10° in the direction of the crystal orientation [011] or [011⁻] {where (⁻) denotes a negative logic symbol for indicating inversion} from (001) plane of GaAs crystal.

Next, on the surface of the substrate 1, a buffer layer (not shown in the figure) made of n-type AlGaAs is formed, and further thereon a first multi-layered film 16 is formed by stacking a first lower clad layer 12 made of n-type AlGaAs, a first active layer 13 comprising a single or multi-layered quantum well structure made of AlGaAs (oscillation wavelength of 780 nm), a first upper clad layer 14 made of p-type AlGaAs, and a first cap layer 15 made of p-type GaAs in this order. It is now allowable to optionally provide, between the first lower clad layer 12 and the first active layer 13, a guide layer having a composition intermediate between those of such layers, and to provide between the first active layer 13 and the first upper clad layer 14 a guide layer having a composition intermediate between those of such layers. All of these layers can be formed by an epitaxial growth method typified by the MOVPE (Metal Organic Vapor Phase Epitaxial growth) method.

Next, a resist pattern (not shown in the figure) is formed on the first multi-layered film 16 so as to selectively cover the portion to be kept as a first laser element, and using such resist pattern as a mask, the first cap layer 15 to the first lower clad layer 12 as well as the buffer layer, are etched in the portion other than that for the first laser element by wet etching such as non-selective etching using a sulfuric acid-base solution, and AlGaAs selective etching using a hydrofluoric acid solution.

By such etching, a first multi-layered film pattern 16a having a plurality of stripes using materials of elements of group III like AlGaAs are formed, and concomitantly therewith a plurality of groove patterns P are formed between each adjacent first multi-layered film patterns 16a. The groove patterns comprises widened portions W1 having a relatively large width and narrowed portions W2 having a narrower width, where the narrowed portions W2 are provided on both sides of each widened portion W1 along the longitudinal direction of the groove pattern P. The widened portions W1 are provided one by one for each formation site of the semiconductor light-emitting device. Thus, the side wall of the first multi-layered film pattern 16a is formed so as to have portions winged toward the width direction. Within such groove patterns P, the surface of the substrate 1 on which second laser elements are to be formed is exposed.

A resist pattern (not shown in the figure) is then formed on the substrate 1 so as to expose only the surface of the substrate 1 which corresponds with the bottom of the widened portion W1, and such surface of the substrate 1 is etched using the resist pattern as an etching mask. A level of the surface of the substrate 1 exposed in the widened portion W1 is thus made lower than in the narrowed portion W2. An etching depth "d" attained by such etching is set so as to allow the active layer in the multi-layered film formed in the next stage to have a same surface level both in the widened portion W1 and the narrowed portion W2.

Figure 2B:
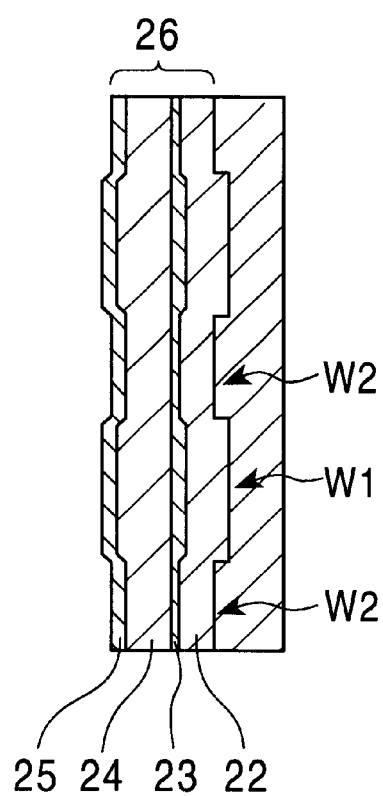

Next, as shown in FIGS. 2A and 2B, an n-type buffer layer (not shown in the figure) comprising a GaAs layer and an InGaP (indium-gallium-phosphorus) layer stacked thereon is formed so as to cover the first multi-layered film pattern 16a and the groove pattern P. Further, on such buffer layer, a second multi-layered film 26 made of a material of elements of group IV such as AlGaInP is formed specifically by stacking an n-type second lower clad layer 22 typically made of AlGaInP, a second active layer 23 comprising a single or multi-layered quantum well structure made of AlGaAs (oscillation wavelength of 650 nm), a second upper clad layer 24 made of p-type AlGaInP, and a second cap layer 25 made of p-type GaAs in this order. It is now allowable to optionally provide between the second lower clad layer 22 and the second active layer 23 a guide layer having a composition intermediate between those of such layers, and to provide between the second active layer 23 and the second upper clad layer 24 a guide layer having a composition intermediate between those of such layers. All of these layers can be formed by the epitaxial growth method typified by the MOVPE (Metal Organic Vapor Phase Epitaxial growth) method.

Next, a resist pattern (not shown in the figure) is formed on the second multi-layered film 26 so as to selectively cover the portion to be kept as the second laser elements as shown in FIGS. 3A to 3D, that is, over the groove pattern P between each adjacent first multi-layered film patterns 16a, and using such resist pattern as a mask, the second multi-layered film 26 is removed in the portion other than that for the second laser elements by wet etching, in which the cap layer is etched using a sulfuric acid-base solution, the layers of elements of group IV are selectively etched using a phosphoric acid/hydrochloric acid-base mixed solution, and the lower clad layer is etched using a hydrochloric acid-base solution. Next, the first cap layer 15 and the second cap layer 25 are etched upon having the portion of both the first multi-layered film pattern 16a and the second multi-layered film pattern 26a to be made into a current injection area protected. Thus, a first current injection layer 15a patterned from the first cap layer 15 and a second current injection layer 25a patterned from the second cap layer 25 are formed. The current injection layers 15a, 25a are provided so as to extend along the multi-layered film patterns 16a, 26a, respectively, which resultantly creates a stripe 13a in a portion just under the current injection layer 15a within the first active layer 13, and, likewise, a stripe 23a in a portion just under the current injection layer 25a within the second active layer 23.

Thereafter, although not shown in the figures, a p-type electrode typically made of Ti/Pt/Au (titanium/platinum/gold) is formed so as to be connected to the current injection layers 15a, 25a while keeping isolated form the multi-layered film patterns 16a, 26a, and an n-type electrode typically made of AuGe/Ni/Au (gold-germanium/nickel/gold) is formed so as to be connected to the substrate 1.

Next, the substrate 1 is divided between, for example, the current injection layers 15a, 25a so that the first multi-layered film pattern 16a and the second multi-layered film pattern 26a adjacent with each other form a pair.

Then the substrate 1, the second multi-layered film pattern 26a and the first multi-layered film pattern 16a are cleft at the center of the narrowed portion W2 of the groove pattern P in which the second multi-layered pattern 26a is formed, in a direction crossing the longitudinal direction of the current injection layers 15a, 25a. Each semiconductor light-emitting device divided to have an area "a" outlined by a two-dot chain line in FIGS. 3A and 3B is thus finished.

The semiconductor light-emitting device thus obtained has a first laser element including the first active layer 13, and a second laser element including the second active layer 23 having a composition different from that of the first active layer 13.

As described by reference to FIGS. 2A and 2B, in such fabrication method, the second multi-layered film 26 is formed so as to cover the groove pattern P having the widened portion W1 composed by the first multi-layered pattern 16a.

Figure 4:
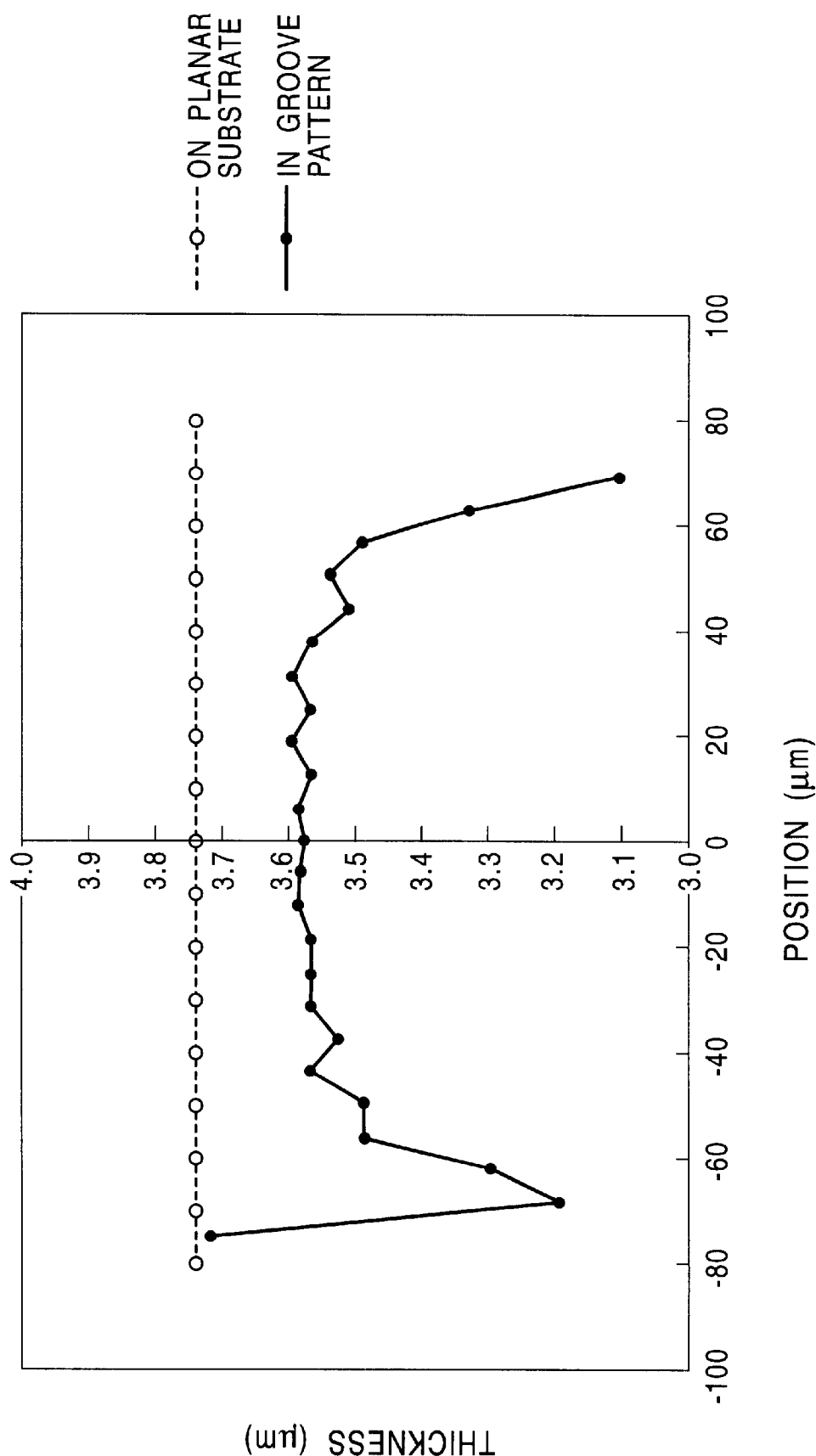
FIG. 4 is a graph showing a film thickness distribution of a material of group IV multi-layered film formed on different substrates.
Figure 5A:
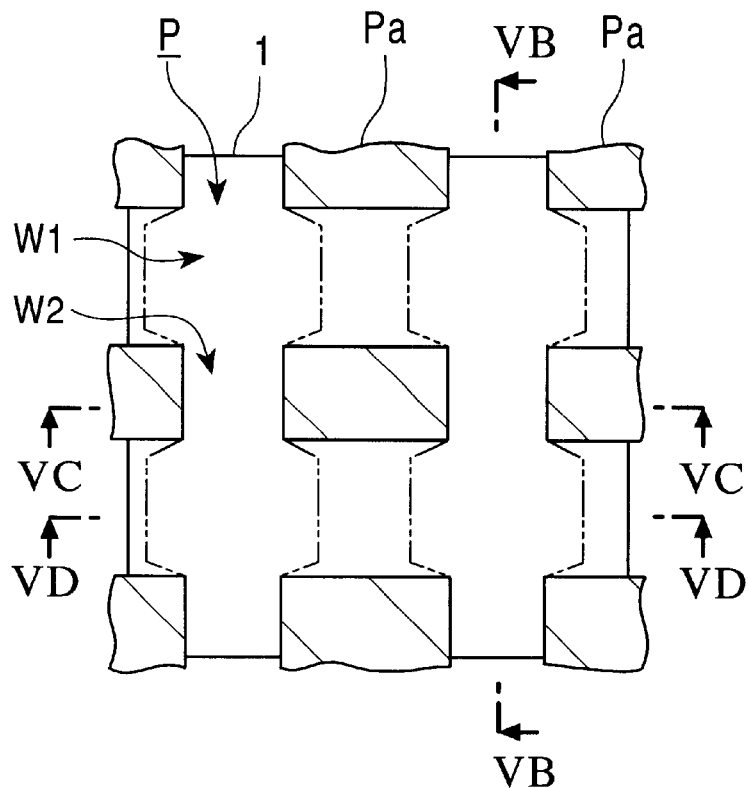
FIGS. 5A to 5D are a schematic plan view and sectional views for explaining a second embodiment.
Figure 5B:
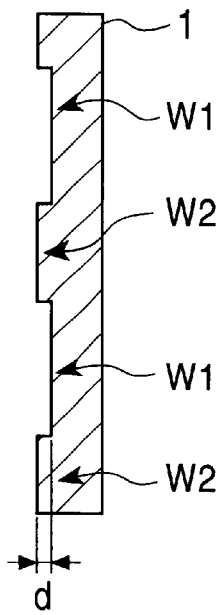
Figure 5C:
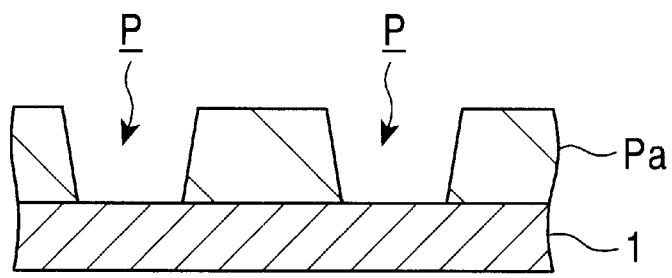
Figure 5D:
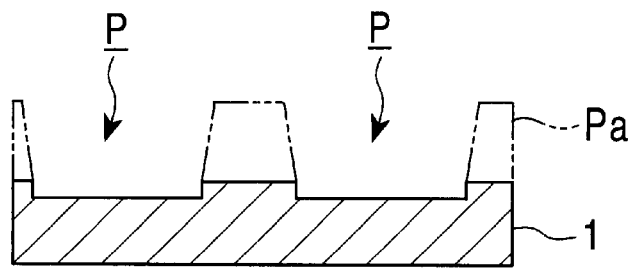
Figure 6A:
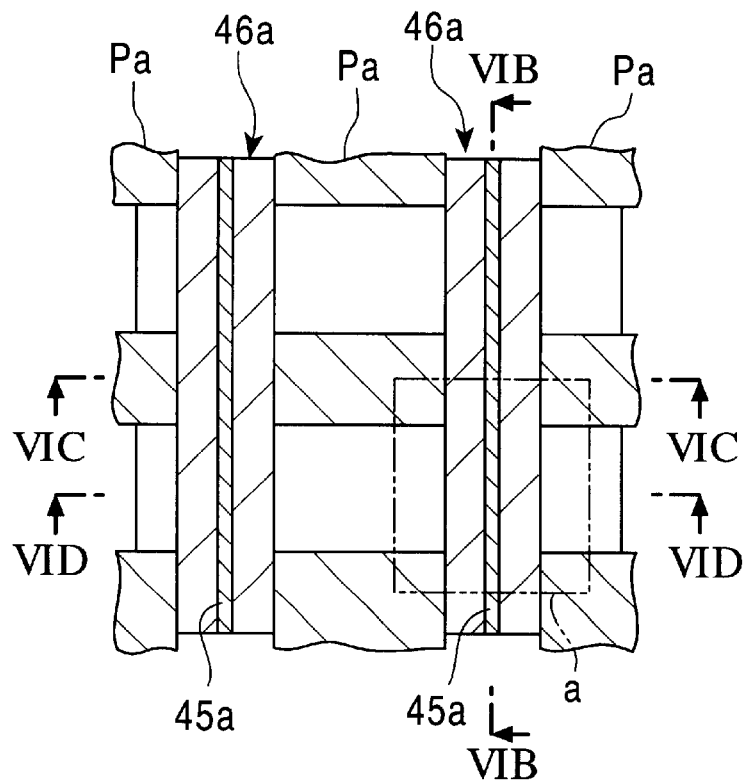
FIGS. 6A to 6D are a schematic plan view and sectional views for explaining a process as continued from FIGS. 5A to 5D.
Figure 6B:
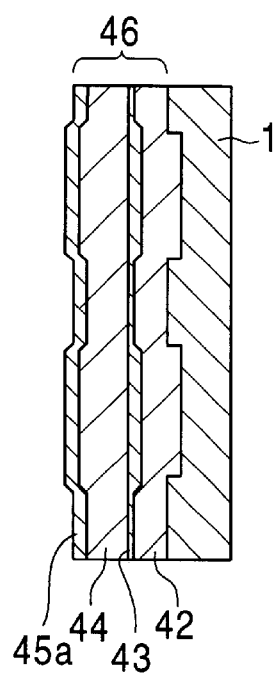
Figure 6C:
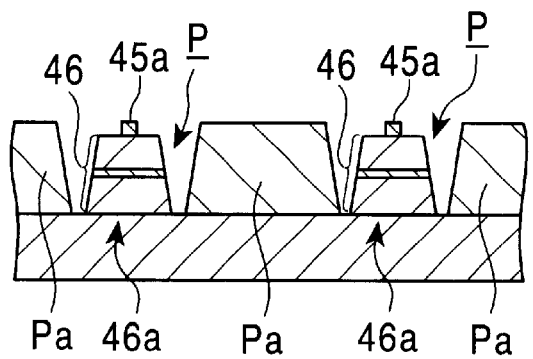
Figure 6D:
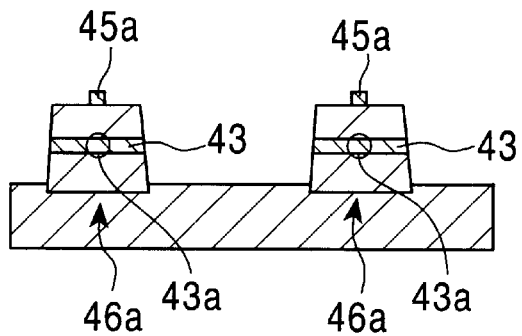
Figure 7A:
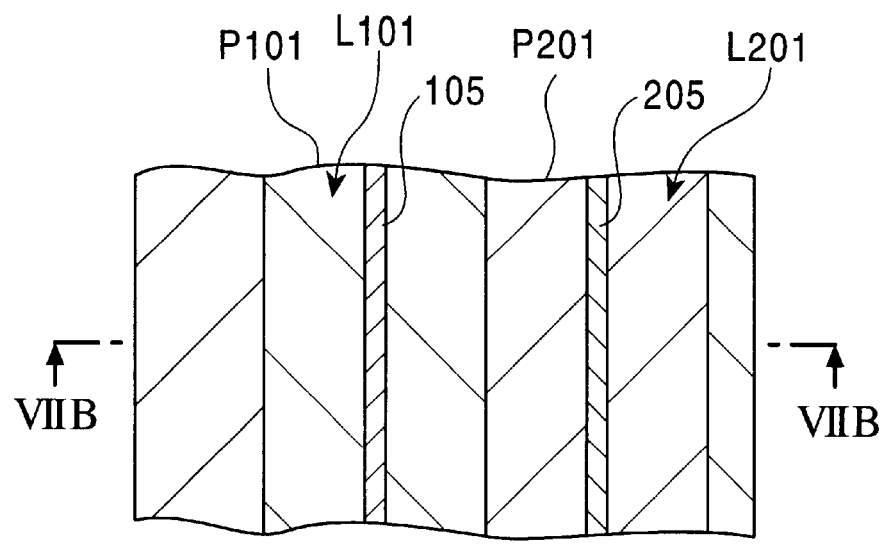
FIGS. 7A and 7B are a schematic plan view and a sectional view for explaining an example of a conventional semiconductor light-emitting device.
Figure 7B:
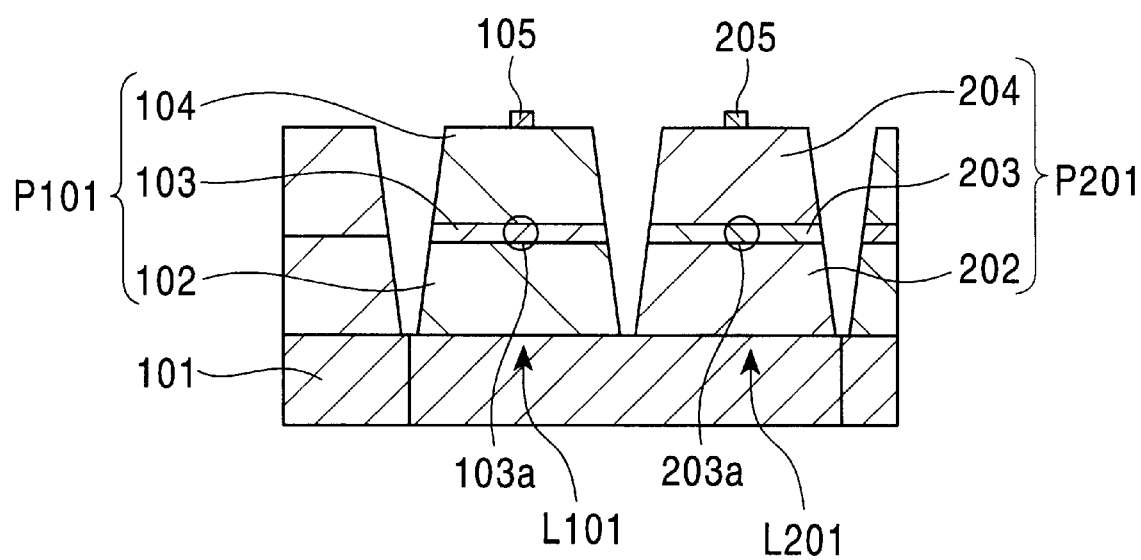

FIG. 4 shows measured values of the film thickness for each portion of the second multi-layered film (including the second cap layer made of GaAs) using the elements of group IV, formed on a flat substrate, and measured values of the film thickness for each portion of the second multi-layered film (including the second cap layer made of GaAs) within the groove pattern using the elements of group IV, formed on a flat substrate. In addition, conditions for the film forming were set equal for all portions. As shown in the graph, the film formation results in a larger thickness of the film on the flat substrate than within the groove pattern, which indicates that the multi-layered film of elements of group IV grows thicker on the plane exposed with a wider opening. This is attributable to the fact that a larger amount of source materials is supplied to a portion exposed with a wider opening (rate determined by supply volume), and that the source materials supplied to the narrowed portion is likely to be consumed due to abnormal film growth at the upper portion of the etched side wall of the groove pattern.

From such observation, it is known that the second multi-layered film 26 formed so as to cover the groove pattern P having the widened portion W1 is grown in a larger thickness in such widened portion W1 than in the narrowed portion W2 within the groove pattern P, as shown in FIG. 2B which is a sectional view taken along the IIB—IIB line. In addition, in the first embodiment, the second multi-layered pattern 26a is cleft so that the portion thereof formed within the widened portion W1 comes into the central portion, and so that the portion thereof formed within the narrowed portion W2 comes into the edge portion as indicated by the two-dot chain lines in FIG. 3A and FIG. 3B which is a sectional view taken along the IIIB—IIIB line. This allows the second laser element containing such cleft second multi-layered film pattern 26a to have the active layer 23, which is thinner in both edge portions than in the central portion, that is, to have a window structure with the active layer 23 having thin edges and a large band gap.

Moreover, in the first embodiment, the bottom of the widened portion W1 of the groove pattern P has a level lower than the narrowed portion by the amount of "d", as shown in FIGS. 1A to 1D. This allows the second active layer 23 to be formed in approximately a uniform level both in the widened portion W1 and the narrowed portion W2 by absorbing the level difference between the widened portion W1 and the narrowed portion W2 with the second lower clad layer 22. Thus, an emitted light from the emissive area in the center portion in the second active layer 23 can be guided linearly to the cleft planes at the end portions without loss, to thereby ensure efficient resonance.

As described in the above, the first embodiment ensures easy fabrication of the double-wavelength semiconductor light-emitting device in which a window structure is provided to either of the semiconductor laser elements (second laser element) by only adding a simple process step such as forming the groove pattern P based on a rough alignment with no need of adding a high precision process. By providing the window structure to the semiconductor laser element of group IV (AlGaInP), a stable emitted light can also be obtained from the semiconductor laser element of group IV, in which achieving a stable light emission has long been a difficult issue.

While the first embodiment deals with the present invention embodied as the double-wavelength semiconductor light-emitting device, the present invention is also applicable to the fabrication of a single-wavelength semiconductor light-emitting device. Such device can be obtained simply by altering the first multi-layered film pattern, which is used for composing the first laser element of group III (AlGaAs) in the first embodiment, into a simple convex pattern. A method of fabrication of such second embodiment will be described below.

Second Embodiment

FIGS. 5A to 5D, and FIGS. 6A to 6D are plan views and sectional views for explaining the second embodiment of the present invention. The following paragraphs describe the present invention embodied as a semiconductor light-emitting device having a single or a plurality of semiconductor laser elements having a same emission wavelength mounted on the same substrate, the explanation herein will be started with a fabrication process thereof.

As shown first in FIGS. 5A to 5D, an n-type off-angled GaAs substrate (simply referred to as "substrate" hereinafter) 1, similar to that used in the first embodiment, is obtained. On the surface of such substrate 1, a plurality of convex AlGaAs patterns Pa 3 µm thick, for example, is formed in an aligned manner, in which groove patterns P similar to those formed in the first embodiment are concomitantly formed on the substrate 1. One groove pattern P composed as a result of forming the convex patterns Pa may be connected with the adjacent groove pattern P at the widened portion W1. In such case, the individual convex patterns Pa will be formed as islands after the area outlined with the two-dot chain line is removed.

Then as in the first embodiment, the surface of the substrate 1 exposed within the widened portion W1 is etched so as to attain a level lower than that in the narrowed portion W2. An etching depth "d" attained by such etching is set so as to allow the active layer in the multi-layered film formed in the next stage to have a same surface level both in the widened portion W1 and the narrowed portion W2.

Thereafter, a multi-layered film 46 having a constitution similar to that of the second multi-layered film in the first embodiment is formed on the substrate 1 as shown in FIGS. 6A to 6D. That is, an n-type buffer layer (not shown in the figure) comprising a GaAs layer and an InGaP layer stacked thereon is formed, and further thereon the multi-layered film 46 of elements of group IV is formed by successively stacking an n-type lower clad layer 42 typically made of AlGaInP, an active layer 43 comprising a single- or multi-layered quantum well structure made of InGaP, an upper clad layer 44 made of p-type AlGaInP, and a cap layer 45 made of p-type GaAs. In addition, between the lower clad layer 42 and the active layer 43, a guide layer having a composition intermediate between those of such layers can be provided optionally, and, between the active layer 43 and the upper clad layer 44, a guide layer having a composition intermediate between those of such layers can also be provided. All of these layers can be formed by the epitaxial growth method typified by the MOVPE (Metal Organic Vapor Phase Epitaxial growth) method.

Next, as shown in FIGS. 6A to 6D, a resist pattern (not shown in the figures) is formed on the multi-layered film so as to selectively cover the portion to be kept as first laser elements, that is, on the groove pattern P between the adjacent convex patterns Pa, and using such resist pattern as a mask, the multi-layered film 46 is etched in the portion other than that for the first laser elements by wet etching, in which the cap layer 45 is etched using a sulfuric acid-base solution, the group IV layers are selectively etched using a phosphoric acid/hydrochloric acid-base mixed solution, and the lower clad layer 42 is etched using a hydrochloric acid-base solution. By such etching, a multi-layered pattern 46a is formed within the groove pattern P associating the convex pattern Pa.

Next, a current injection layer 45a as patterned from the cap layer 45 is formed on the upper portion of the multi-layered film pattern 46a, which resultantly creates a stripe 43a in a portion just underneath the current injection layer 45a within the first active layer 43.

Electrodes, not shown in the figure, are then formed as described in the first embodiment, and the substrate 1 is divided so as to have one stripe or a plurality of stripes of the multi-layered film patterns 46a formed thereon.

Then the multi-layered film pattern 46a is cleft at the center of the narrowed portion W2 of the groove pattern P in a direction crossing the longitudinal direction of the current injection layer 45a. A semiconductor light-emitting device divided to have an area "a" outlined by a two-dot chain line in the figures is thus finished.

In the semiconductor light-emitting device thus obtained, the multi-layered film 46 for composing the semiconductor laser element is formed so as to cover the groove pattern P, which is formed in association with the convex patterns Pa, as shown in FIGS. 5A to 5D. Thus the semiconductor light-emitting device will have a window structure similar to the second laser element of the semiconductor light-emitting device in the first embodiment.

Moreover, the bottom of the widened portion W1 of the groove pattern P has a level lower than that of the narrowed portion W2 by "d". This allows the active layer 43 to be formed in approximately a uniform level like in the case of the first embodiment, so that the emitted light can linearly be guided to the cleft planes at the end portions without loss, to thereby ensure efficient resonance.

As described in the above, the second embodiment is also suitable for obtaining the semiconductor light-emitting device having the window structure only by adding a simple process step such as forming the groove pattern P based on a rough alignment, with no need of adding a high precision process.

The present invention is also applicable to fabrication of a semiconductor light-emitting device having an array-type high-output semiconductor laser element. Although the embodiments 1 and 2 deal with the cases in which the semiconductor light-emitting device which has the window structure using the multi-layered film made of a group IV material such as AlGaInP, such window structure can also be formed for a semiconductor light-emitting device in which the multi-layered film is formed using a group III material such as AlGaAs; or, for a semiconductor light-emitting device composed of a GaN-base (gallium nitride-base) material or a ZnSe-base (zinc-selenium-base) material, both of which achieving good results. It is however to be noted that it is necessary to properly select source materials for the clad layer, active layer and other layers and etching solutions for etching such layers when the semiconductor light-emitting device is fabricated using such GaN-base material or such ZnSe-base material.

What is claimed is:

1. A semiconductor light-emitting device having on a substrate a semiconductor light-emitting element comprising:

a multi-layered film pattern composed of a lower clad layer, an active layer and an upper clad layer of a conduction type different from that of said lower clad layer, wherein said layers are stacked in this order; and a stripe of a current injection layer provided on said multi-layered film pattern so as to extend over both edges of said multi-layered film pattern; wherein, said active layer is formed so that both end portions thereof along the longitudinal direction of said current injection layer is thinner than the central portion; and said active layer at the central portion is thicker over an entire upper surface of the lower clad layer in a traverse direction with respect to the longitudinal direction of the current injection layer;

wherein the surface level of said substrate underneath said multi-layered film pattern is formed lower in the central portion than in both edge portions along the longitudinal direction of said current injection layer.

2. The semiconductor light-emitting device as claimed in claim 1, wherein, said multi-layered film pattern has on sides in a direction of the width thereof, which is set in a direction approximately perpendicular to the longitudinal direction of said electron injection layer, a projected pattern for limiting the width of both edge portions of said multi-layered pattern.

3. The semiconductor light emitting device as claimed in claim 2, wherein, said projected pattern constitutes a multi-layered film pattern composing other semiconductor light-emitting elements provided on said substrate.

4. A semiconductor light-emitting device having on a substrate a semiconductor light-emitting element comprising:

a multi-layered film pattern composed of a lower clad layer, an active layer and an upper clad layer of a conduction type different from that of said lower clad layer, wherein said layers are stacked in this order; and a stripe of a current injection layer provided on said multi-layered film pattern so as to extend over both edges of said multi-layered film pattern; wherein, said active layer is formed so that both end portions thereof along the longitudinal direction of said current injection layer is thinner than the central portion; and said active layer at the central portion is thicker over an entire upper surface of the lower clad layer in a traverse direction with respect to the longitudinal direction of the current injection layer;

wherein the multi-layered film pattern is wider in the traverse direction at the central portion than at the end portions.

5. The semiconductor light-emitting device as claimed in claim 4, wherein, said multi-layered film pattern has on sides in a direction of the width thereof, which is set in a direction approximately perpendicular to the longitudinal direction of said electron injection layer, a projected pattern for limiting the width of both edge portions of said multi-layered pattern.

6. The semiconductor light-emitting device as claimed in claim 5, wherein, said projected pattern constitutes a multi-layered film pattern composing other semiconductor light-emitting elements provided on said substrate.

* * * * *